(12) United States Patent
Mori et al.

(10) Patent No.: US 7,436,010 B2
(45) Date of Patent: Oct. 14, 2008

(54) SOLID STATE IMAGING APPARATUS, METHOD FOR DRIVING THE SAME AND CAMERA USING THE SAME

(75) Inventors: Mitsuyoshi Mori, Kyoto (JP); Takumi Yamaguchi, Kyoto (JP); Takahiko Murata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 233 days.

(21) Appl. No.: 10/706,918

(22) Filed: Nov. 14, 2003

(65) Prior Publication Data

US 2004/0159861 A1 Aug. 19, 2004

(30) Foreign Application Priority Data

Feb. 13, 2003 (JP) ............................. 2003-034692

(51) Int. Cl.
*H01L 31/062* (2006.01)
(52) U.S. Cl. ...................... 257/292; 257/222; 257/444; 257/E27.132
(58) Field of Classification Search ......... 257/444–445, 257/223, 291, 292, E27.132
See application file for complete search history.

(56) References Cited

U.S. PATENT DOCUMENTS

| | | | |
|---|---|---|---|
| 5,708,263 A * | 1/1998 | Wong | 250/208.1 |
| 5,955,753 A * | 9/1999 | Takahashi | 257/292 |
| 6,091,449 A | 7/2000 | Matsunaga et al. | |
| 6,352,869 B1 * | 3/2002 | Guidash | 438/16 |
| 6,541,794 B1 * | 4/2003 | Patterson et al. | 257/59 |
| 6,552,323 B2 * | 4/2003 | Guidash et al. | 250/208.1 |
| 6,657,665 B1 | 12/2003 | Guidash | |

(Continued)

FOREIGN PATENT DOCUMENTS

EP 0 845 900 A1 6/1998

(Continued)

OTHER PUBLICATIONS

White et al., "Characterization of Surface Channel CCD Image Arrays at Low Light Levels", IEEE Journal of Solid State Circuits, vol. sc-9, No. 1, Feb. 1974, pp. 1-13.

(Continued)

*Primary Examiner*—Howard Weiss
*Assistant Examiner*—John Ingham
(74) *Attorney, Agent, or Firm*—McDermott Will & Emery LLP

(57) ABSTRACT

A solid state imaging apparatus includes: a plurality of photoelectric conversion cells each including a plurality of photoelectric sections arranged in an array of at least two rows and two columns; a plurality of floating diffusion sections each being connected to each of ones of the photoelectric sections which are included in the same row of each said photoelectric conversion via each of a plurality of transfer transistors, and being shared by said ones of the photoelectric sections; a plurality of read-out lines each being selectively connected to at least two of the transfer transistors; and a plurality of pixel amplifier transistors each detecting and outputting the potential of each said the floating diffusion section. Charges of the photoelectric conversion sections each being connected to one of the read-out lines and being read out by the transfer transistors are read out by different floating diffusion sections.

17 Claims, 10 Drawing Sheets

U.S. PATENT DOCUMENTS

2001/0052941 A1    12/2001    Matsunaga et al.
2002/0018131 A1    2/2002     Kochi
2002/0145582 A1*   10/2002    Yamazaki et al. ............. 345/92

FOREIGN PATENT DOCUMENTS

| EP | 0 926 738 A2 | 6/1999 |
|---|---|---|
| EP | 0 954 032 A2 | 11/1999 |
| JP | 11-195776 | 7/1999 |
| JP | 11-312800 | 11/1999 |
| JP | 2000-12821 A | 1/2000 |
| JP | 2000-059697 | 2/2000 |
| JP | 2000-78475 A | 3/2000 |
| JP | 2000-224482 A | 8/2000 |
| JP | 2001-298177 A | 10/2001 |
| JP | 2001-326856 A | 11/2001 |
| JP | 2002-077731 | 3/2002 |
| KR | 2000-0052598 | 8/2000 |
| WO | WO 97/07630 | 2/1997 |

OTHER PUBLICATIONS

Chinese Office Action Issued in corresponding Chinese Patent Application No. CN 200380100976.6, dated Feb. 2, 2007.

Japanese Office Action issued in corresponding Japanese Patent Application No. JP 2004-034818, dated Oct. 24, 2006.

* cited by examiner

FIG. 9

| FD SECTION | PIXEL AMPLIFIER | RESET GATE | APERTURE RATIO |
|---|---|---|---|
| A REGION, B REGION, C REGION | A REGION, B REGION, C REGION | A REGION, B REGION, C REGION | 10% |
| A REGION, B REGION, C REGION | A REGION, B REGION, C REGION | D REGION, B REGION, E REGION | 25% |
| A REGION, B REGION, C REGION | D REGION, B REGION, E REGION | A REGION, B REGION, C REGION | 20% |
| A REGION, B REGION, C REGION | D REGION, B REGION, E REGION | D REGION, B REGION, E REGION | 35% |
| D REGION, B REGION, E REGION | A REGION, B REGION, C REGION | A REGION, B REGION, C REGION | 20% |
| D REGION, B REGION, E REGION | A REGION, B REGION, C REGION | D REGION, B REGION, E REGION | 20% |
| D REGION, B REGION, E REGION | D REGION, B REGION, E REGION | A REGION, B REGION, C REGION | 20% |
| D REGION, B REGION, E REGION | D REGION, B REGION, E REGION | D REGION, B REGION, E REGION | 20% |

SOLID STATE IMAGING APPARATUS, METHOD FOR DRIVING THE SAME AND CAMERA USING THE SAME

BACKGROUND OF THE INVENTION

The present invention relates to a solid state imaging apparatus in which a plurality of photoelectric conversion sections are arranged in an array, a method for driving the solid state imaging apparatus and a camera using the solid state imaging apparatus.

FIG. 10 is a diagram illustrating a general circuit configuration for a MOS type image sensor, i.e., a known solid imaging apparatus (e.g., see M. H. White, D. R. Lange, F. C. Blaha and I. A. Mach, "Characterization of Surface Channel CCD Image Arrays at Low Light Levels", IEEE J. Solid-State Circuits. SC-9, pp. 1-13 (1974)).

As shown in FIG. 10, a photoelectric conversion cell includes a photodiode (PD) section 101, a transfer transistor 113, a reset transistor 122, a pixel amplifier transistor 123, a select transistor 152, a floating diffusion (FD) section 109, a power supply line 131 and an output signal line 138.

The PD section 101 of which the anode is grounded is connected to the drain of the transfer transistor 113 at the cathode. The source of the transfer transistor 113 is connected to the respective sources of the FD section 109, the gate of the pixel amplifier transistor 123 and the source of the reset transistor 122. The gate of the transfer transistor 113 is connected to a read-out line 134. The reset transistor 122 which receives a reset signal 137 at the gate includes a drain connected to the drain of the pixel amplifier transistor 123 and the power supply line 131. The source of the pixel amplifier transistor 123 is connected to the drain of the select transistor 152. The select transistor 152 receives a selection signal SEL at the gate and includes a source connected to the output signal line 138.

The output signal line 138 is connected to the source of a load gate 125. The gate of the load gate 125 is connected to a load gate line 140 thereof and the drain is connected to a source power supply line 141.

In this configuration, a predetermined voltage is applied to the load gate line 140 so that the load gate 125 becomes a constant current source, and then the transfer transistor 113 is temporarily turned ON to transfer charge photoelectric-converted in the PD section 101 to the FD section 109. Then, the potential of the PD section 101 is detected by the pixel amplifier transistor 123. In this case, by turning the select transistor 152 ON, signal change can be detected through the output signal line 138.

However, in the known solid state apparatus, four transistors 113 122, 123 and 152 and five lines 131, 134, 137, 138 and 150 are required for total in each photoelectric conversion cell. Accordingly, the areas of transistor and line sections in a cell are increased. For example, if a photoelectric conversion cell is designed, assuming that the area of a photoelectric conversion cell is 4.1 µm×4.1 µm, with the design rule of 0.35 µm, the aperture ratio of the PD section 101 to the photoelectric conversion cell is only about 5% Therefore, it is difficult to ensure a sufficiently large area of opening of the PD section 101 and also to reduce the size of the photoelectric conversion cell.

SUMMARY OF THE INVENTION

It is an object of the present invention to solve the above-described problems and, to reduce in a FDA (floating diffusion amplifier) system, the size of a photoelectric conversion cell while increasing an aperture area of a photoelectric conversion section.

To achieve the above-described object, the present invention has been deviced, so that a configuration in which a transistor and an interconnect can be shared by a plurality of photoelectric conversion (PD) sections is used in a solid state imaging apparatus.

Specifically, a first solid sate imaging apparatus includes: a plurality of photoelectric conversion cells each including a plurality of photoelectric sections arranged in an array of at least two rows and two columns; a plurality of floating diffusion sections each being connected to each of ones of the photoelectric sections which are included in the sane row of each said photoelectric conversion cell via each of a plurality of transfer transistors, and being shared by said ones of the photoelectric sections which are included in the same row; a plurality of read-out lines each being selectively connected to at least two of the transfer transistors; and a plurality of pixel amplifier transistors each detecting and outputting the potential of each said the floating diffusion section. In the apparatus, respective charges of the photoelectric conversion sections each being connected to one of the read-out lines and being read out by the transfer transistors are read out by different floating diffusion sections.

In the first solid imaging apparatus, each said floating diffusion section is shared by ones of the photoelectric conversion sections included in the same row, and furthermore, respective charges of the photoelectric conversion sections each being connected to one of the read-out lines and being read out by the transfer transistors are read out by different floating diffusion sections. Thus, the number of read-out lines per photoelectric conversion cell becomes 0.5. As a result, the aperture ratio of the photoelectric conversion sections to the photoelectric conversion cell can be increased and also the size of the photoelectric cell can be reduced.

In the first solid state imaging apparatus, it is preferable that each said read-out line is connected to a transfer transistor connected to ones of the photoelectric conversion sections which are included in the same column. Thus, charges of at least two of said ones of the photoelectric conversion sections which are included in the same column can be output through a floating diffusion section, a pixel amplifier transistor and a signal line.

Moreover, in the first solid state imaging apparatus, it is preferable that wherein each said read-out line is connected to a transfer transistor connected to ones of the photoelectric conversion sections which are included in two adjacent columns, respectively. Thus, charges of at least two of said ones of the photoelectric conversion sections which are included in two adjacent columns, respectively, can be output through a floating diffusion section, a pixel amplifier transistor and a signal line.

In the first solid state imaging apparatus, it is preferable that each said floating diffusion section and each said pixel amplifier transistor are shared by a row which is read out bar a transfer transistor connected to one of the read-out line and another row which is adjacent to the read-out row.

It is preferable that the first solid slate imaging apparatus further includes: a signal line for outputting a signal from each said pixel amplifier transistor to the outside; and a select transistor which is provided between the pixel amplifier transistor and the signal line to selectively conduct between the pixel amplifier transistor and the signal line. Thus, charges from one of the photoelectric conversion sections which are included in adjacent rows, respectively, can be detected through a shared signal line.

In the first solid state imaging apparatus, it is preferable that each said floating diffusion section and each said pixel amplifier transistor are shared by photoelectric conversion sections which are adjacent to each other in the row direction or in the column direction. Thus, the aperture ratio of the photoelectric conversion sections to the photoelectric conversion cell can be increased and also the size of the photoelectric cell can be reduced.

In the first solid state imaging apparatus, it is preferable that in each said floating diffusion section, a reset section for resetting charge stored in the floating diffusion section is provided. Thus, it is possible to stop, after charge read out from a photoelectric conversion section has been detected by an amplifier, detection of charge by the pixel amplifier transistor.

In the first solid state imaging apparatus, it is preferable that the photoelectric conversion sections are arranged so as to be spaced apart from one another by a certain distance in the row direction or in the column direction. Thus, a high quality image can be obtained from signals read out from the photoelectric conversion sections.

It is preferable that the first solid state imaging apparatus further includes a signal processing circuit for processing an output signal from each said pixel amplifier transistor. Thus, a high quality image can be obtained.

In the first solid state imaging apparatus, it is preferable that the photoelectric conversion cells are separated from one another by a power supply line which also functions as a light-shielding film. Thus, a power supply line can be formed in a different interconnect layer from an interconnect layer in which an output signal line connected to a pixel amplifier transistor is formed. Therefore, the size of a photoelectric conversion cell can be further reduced and also the aperture area can be increased.

A method for driving a solid state imaging apparatus according to the present invention is directed to a method for driving the first solid state imaging apparatus of the present invention and includes: a first step of transferring, in each said photoelectric conversion cell, by a first read-out line of the read-out lines, signal charges from ones of the photoelectric conversion sections which are not included in the same row but included in two columns adjacent to each other, respectively to one of the floating diffusion sections connected to said ones of the photoelectric conversion sections, and a second step or transferring, by a second read-out line of the read-out lines, signal charges from ones of the photoelectric conversion sections which have not been read out in the first step to the same floating diffusion section connected to said ones of the photoelectric conversion sections as that in the first step.

A second solid state imaging apparatus according to the present invention includes: a plurality of photoelectric conversion cells each including a plurality of photoelectric sections arranged in an array of at least two rows; a plurality of floating diffusion sections each being connected via each of a plurality of transfer transistors, to each of ones of the photoelectric conversion sections which are included in adjacent rows, respectively, and which are included in the same column in each said photoelectric conversion cell, and each being shared by said ones of the photoelectric conversion sections; a plurality of read-out lines each being connected to one of the transfer transistors and independently reading out charge from each of said ones of the photoelectric conversion sections to each said floating diffusion section shared by said ones of the photoelectric conversion sections, and a plurality of pixel amplifier transistors each detecting and outputting the potential of the floating diffusion section.

In the second solid state apparatus each said floating diffusion section is connected to some of the plurality of transfer transistors, is shared by ones of the photoelectric conversion sections which are included in adjacent rows, respectively, and which are included in the same. Furthermore, some of the plurality of read-out lines each independently reading out charge from each of said ones of the photoelectric conversion sections are connected to each said transfer transistor. Thus, a row-select transistor which is usually provided is not needed. As a result, the number of interconnects per photoelectric conversion section is reduced from 5 to 3.5. Therefore, the area of the photoelectric conversion cell itself can be reduced while increasing the area of the photoelectric sections.

It is preferable that the second solid state imaging apparatus further includes a reset transistor for setting charge stored in each said floating diffusion section and the drain of the reset transistor is connected to the drain of the pixel amplifier transistor so that a drain is shared by the reset transistor and the pixel amplifier transistor. Thus, an interconnect connecting between the drain of the reset transistor and the drain of the pixel amplifier transistor can be shared. Accordingly, the number of interconnects per the photoelectric conversion cell can be further reduced.

In the second solid state imaging apparatus, it is preferable that each said floating diffusion section is arranged between ones of the photoelectric conversion sections which are adjacent to each other in the row direction in each said photoelectric conversion cell. Thus, the area of floating diffusion sections per photoelectric conversion cell can be reduced.

In the second solid state imaging apparatus, it is preferable that each said transfer transistor is made of an MIS transistor, and a gate of the MIS transistor is arranged in the column direction. Thus, each said the read-out line can be also function as an interconnect of a transfer transistor, so that the area of the read-out lines occupying the photoelectric conversion cell can be reduced.

Moreover, in the second solid state imaging apparatus, it is preferable that each said pixel amplifier transistor is arranged between rows which include some of the photoelectric conversion sections and are adjacent to each other in each said photoelectric conversion cell. Thus, the, area of the pixel amplifier transistor per photoelectric conversion cell can be reduced whereas the area of the photoelectric conversion sections can be increased. Therefore, light sensitivity is increased.

Moreover, in the second solid state imaging apparatus, it is preferable that each said pixel amplifier transistor and each said floating diffusion section are arranged between adjacent ones of the read out lines. Thus, an interconnect connecting between the pixel amplifier transistor and the floating diffusion section can be shortened, so that the areas of the pixel amplifier transistor and the floating diffusion section per photoelectric conversion cell can be reduced.

Moreover, in the second solid state imaging apparatus, it is preferable that each said pixel amplifier transistor is arranged between ones of the photoelectric cells which are adjacent to each other in the column direction. Thus, an opening for each said photoelectric conversion section can be formed so as to have a large area extending in the row direction. Therefore, even if the size of the cell is reduced, light sensitivity can be maintained.

Moreover, in the second solid state imagine apparatus, it is preferable that each said transfer transistor is made of an MIS transistor, and each said pixel amplifier transistor is arranged between respective gates of the MIS transistor and another MIS transistor. Thus, an empty region located in an area of the cell in which a row and a column intersect to each other can be utilized. Therefore, the area of the photoelectric conversion sections can be increased and the area of the photoelectric conversion cell itself can be reduced.

In the case where the second solid state imaging apparatus includes the reset transistors, it is preferable that each said reset transistor is arranged between rows which include some of the photoelectric conversion sections and are adjacent to each other in each said photoelectric conversion cell. Thus, the area of the reset transistors per photoelectric conversion section can be reduced. Therefore, the area of the photoelectric conversion sections can be increased and the area of the photoelectric conversion cell itself can be reduced.

Moreover, in the case where the second solid state imaging apparatus includes the reset transistors, it is preferable that each said pixel amplifier transistor and the floating diffusion section are arranged between adjacent ones of the read out lines. Thus, an interconnect between the floating diffusion section can be omitted and the source of the reset transistor and the floating diffusion section can be connected to each other to be shared. Therefore, the areas of the reset transistors and the floating diffusion sections per photoelectric conversion cell can be reduced.

Moreover, in the case where the second solid state imaging apparatus includes the reset transistors it is preferable that each said reset transistor is connected to a line arranged between ones of the photoelectric cells which are adjacent to each other in the row direction. Thus, pitches of the photoelectric sections in row directions can be matched in a simple manner, so that resolution is improved.

Moreover, in the case where the second solid state imaging apparatus includes the reset transistors, it is preferable that each said reset transistor is arranged between ones of the photoelectric conversion cells which are adjacent to each other in the column direction. Thus, an opening for each said photoelectric conversion section can be formed so is to have a large area extending in the row direction. Therefore, even if the size of the cell is reduced, light sensitivity can be maintained.

In this case, it is preferable that each said transfer transistor is made of an MIS transistor, and each said reset transistor is arranged between respective gate of the MIS transistor and another MIS transistor. Thus, an empty region located in the area of the cell in which a row and a column intersect to each other can be utilized. Therefore, the area of the photoelectric conversion sections can be increased and the area of the photoelectric conversion cell itself can be reduced.

In the second solid state imaging apparatus, it is preferable that each said floating diffusion section is arranged between ones of the photoelectric conversion cells which are adjacent to each other in the column direction. Thus, the area of the floating diffusion sections per photoelectric conversion cell can be reduced.

In the second solid state imaging apparatus, it is preferable that the photoelectric conversion sections are arranged so as to be spaced apart from one another by a certain distance in at least one of the row direction and the column direction. Thus, inclination in the resolution of an image taken can be corrected. Therefore, a high quality image can be obtained.

In the case where the second solid state imaging apparatus includes the reset transistors, it is preferable that the line connecting respective drains of the reset transistor and the pixel amplifier transistor also functions as a light-shielding film. Thus, the number of interconnects per photoelectric conversion cell can be reduced. Therefore, the area of the photoelectric sections can be increased and the area of the photoelectric conversion cell itself can be reduced.

It is preferable that each of the first and second solid state imaging apparatus further includes a signal processing circuit for processing an output signal output from each said pixel amplifier transistor. Thus, a high resolution image can be obtained.

A camera according to the present invention includes the first or second solid state imaging apparatus of the present invention. Thus, the camera of the present invention can achieve a high resolution image.

BRIEF DESCRIPTION OF THE DRAWINGS

FIG. 9 is a table showing the aperture ratio of PD sections to a photoelectric conversion cell in each of regions A through E of FIG. 8 where a transistor and the like are arranged.

DESCRIPTION OF THE PREFERRED EMBODIMENTS

First Embodiment

A first embodiment of the present invention will be described with reference to the accompanying drawings.

Figure 1:
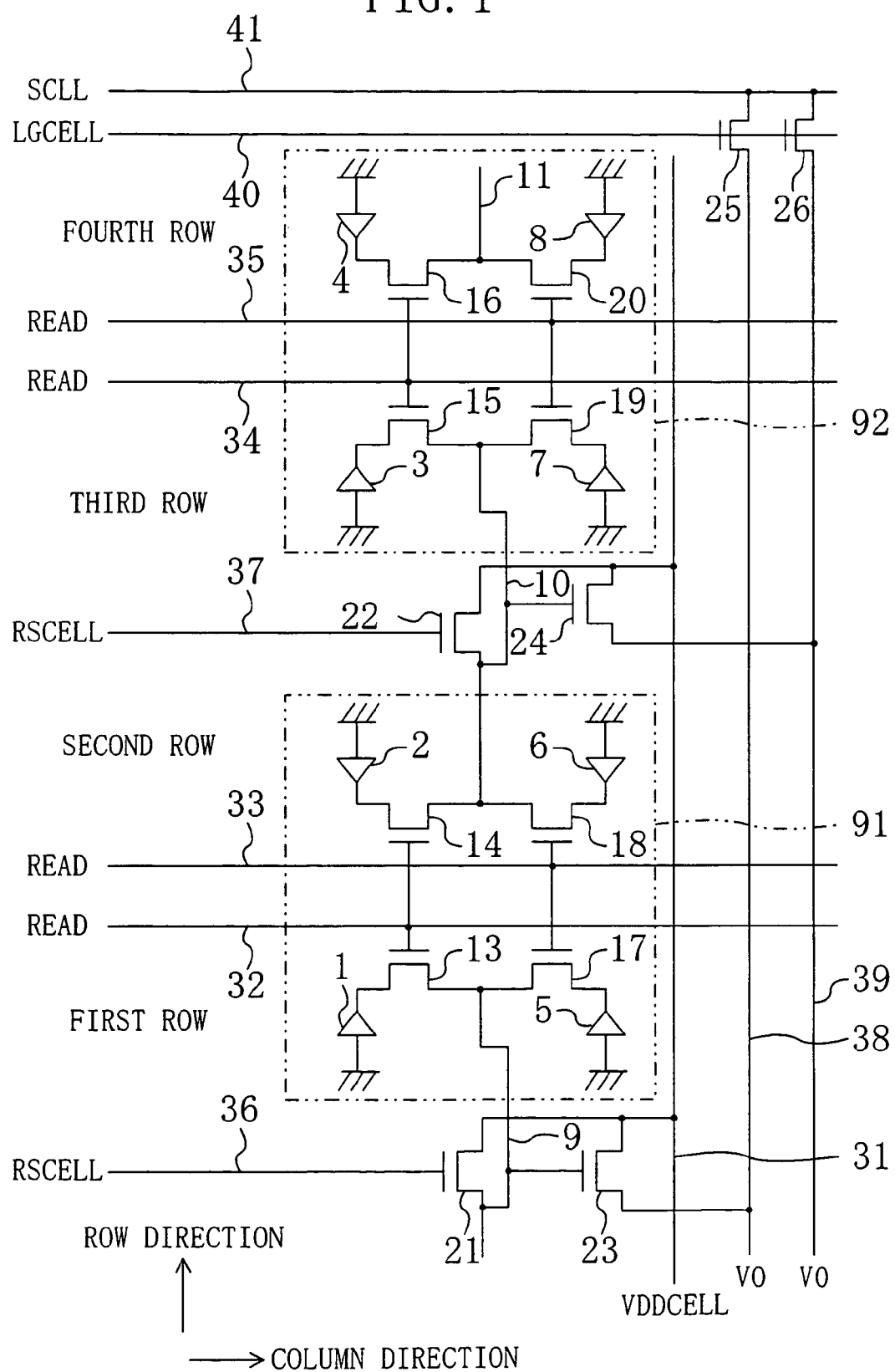
FIG. 1 is a circuit diagram illustrating an exemplary photoelectric conversion cell in a solid state imaging apparatus according to a first embodiment of the present invention.

FIG. 1 is a circuit diagram illustrating an exemplary photoelectric conversion cell in a solid state imaging apparatus according to the first embodiment of the present invention.

As shown in FIG. 1, for example, photoelectric conversion (PD) sections 1, 2, 3 and 4 each of which is made of a photodiode and converts incident light to electric energy are arranged in this order in the row direction. Furthermore, PD sections 5, 6, 7 and 8 are arranged in this order in the row direction so that the PD sections 5, 6, 7 and 8 are adjacent to the PD sections 1, 2, 3 and 4, respectively, in the column direction.

Here, in this application, the row direction means to be the direction in which a row number increases and the column direction means to be the direction in which a column number increases.

Between the first and $0^{th}$ rows (not shown), a first floating diffusion (FD) section 9 for storing photoelectric-converted charges from the PD sections 1 and 5 included in the first row and PD sections included in the $0^{th}$ row is provided. Between the second and third rows, a second floating diffusion section 10 for storing photoelectric-converted charges from the PD sections 2 and 6 included in the second row and the PD sections 3 and 7 included in the third row is provided so as to be surrounded by the PD sections 2, 3, 6 and 7. Between the fourth and fifth rows (not shown), a third floating diffusion section 11 for storing photoelectric-converted charges from the PD sections 4 and 8 included in the fourth row and PD sections included in the fifth row is provided. In this manner, each of the FD sections 9, 10 and 11 is shared by four PD sections.

In this case, a cell including the PD sections 1, 2, 5 and 6 is a first photoelectric conversion cell 91 and a cell including the PD sections 3, 4, 7 and 8 is a second photoelectric conversion cell 92.

In the first photoelectric conversion cell 91, a transfer transistor 13 made of an N channel FET for transferring charge from the PD section 1 to the first FD section 9 is connected between the PD section 1 included in the first row and the first FD section 9, and a transfer transistor 17 made of an N channel FET for transferring charge from the PD section 5 to the first FD section 9 is connected between the PD section 5 and the first FD section 9.

Moreover, in the first photoelectric conversion cell 91, a transfer transistor 14 made of an N channel FET for transferring charges from the PD section 2 to the second FD section 10 is connected between the PD section 2 included in the second row and the second FD section 10, and a transfer transistor 18 made of an N channel FET for transferring charges from the PD section 6 to the second FD section 10 is connected between the PD section 6 and the second FD section 10.

As a characteristic of the first embodiment, the transfer transistor 13 included in the first row, and the transfer transistor 14 included in the second row are connected to a first read-out (READ) line 32 while the transfer transistor 17 included in the first row and the transfer transistor 18 included in the second row are connected to a second READ line 33.

In the second photoelectric conversion cell 92, a transfer transistor 15 made of an N channel FET for transferring charge from the PD section 3 to the second FD sections 10 is connected between the PD section 3 included in the third row and the second FD section 10, and a transfer transistor 19 made of an N channel FET for transferring charge from the PD section 7 to the second FD section 10 is connected between the PD section 7 and the second FD section 10.

Moreover, in the second photoelectric conversion cell 92, a transfer transistor 16 made of an N channel FET for transferring charges from the PD section 4 to the third FD section 11 is connected between the PD section 4 included in the fourth row and the third FD section 11, and a transfer transistor 20 made of an N channel FET for transferring charges from the PD section 8 to the third FD section 11 is connected between the PD section 8 and the third FD section 11.

Also, in this cell, the transfer transistor 15 included in the third row and the transfer transistor 16 included in the fourth row are connected to the third READ line 34, while the transfer transistor 19 included in the third row and the transfer transistor 20 are connected to the fourth READ line 35.

To the first FD section 9, a first reset transistor 21 made of an N channel FET is connected. The first reset transistor 21 includes a source connected to the first FD section 9, a drain connected to a photoelectric conversion cell power supply (VDDCELL) line 31 and a gate connected to a first reset pulse (RSCELL) line 36. Thus, charge stored in the first FD section 9 is made to flow through the VDDCELL line 31 by a RSCELL signal.

In the same manner, a second reset transistor 22 made of an N channel FET is connected to the second FD section 10. The second reset transistor 22 includes a source connected to the second FD section 10, a drain connected to the VDDCELL line 31 and a gate connected to a second RSCELL line 37. Note that although not shown in FIG. 1, a reset transistor of the same configuration as that of the first reset transistor 21 or the like is provided in the third FD section 11.

To the first FD section 9 and the first reset transistor 21, a first pixel amplifier transistor 23 made of an N channel FET is connected. The first pixel amplifier transistor 23 includes a gate connected to the first FD section 9 a drain connected to the VDDCELL line 31 and a source connected to a first output signal (VO) line 38.

In the same manner, a second pixel amplifier transistor 24 made of an N channel FET is connected to the second FD section 10 and the second reset transistor 22. The second pixel amplifier transistor 24 includes a gate connected to the second FD section 10, a drain connected to the VDDCELL line 31 and a source connected to a second VO line 39.

The first VO line 38 and the second VO line 39 are connected to not only the pixel amplifier transistors 23 and 24, respectively, but also first and second load transistors 25 and 26, respectively. Each of the first and second load transistor 25 and 26 is made of an N channel for constituting a source follower amplifier. A load gate (LGCELL) line 40 is connected to each of the gates of the first and second load transistors 25 and 26. A source power supply (SCLL) line 41 is connected to each of the respective drains of first and second load transistors 25 and 26.

Hereinafter the operation of the solid state imaging apparatus having the above-described configuration will be described with reference to the accompanying drawings.

Figure 2:
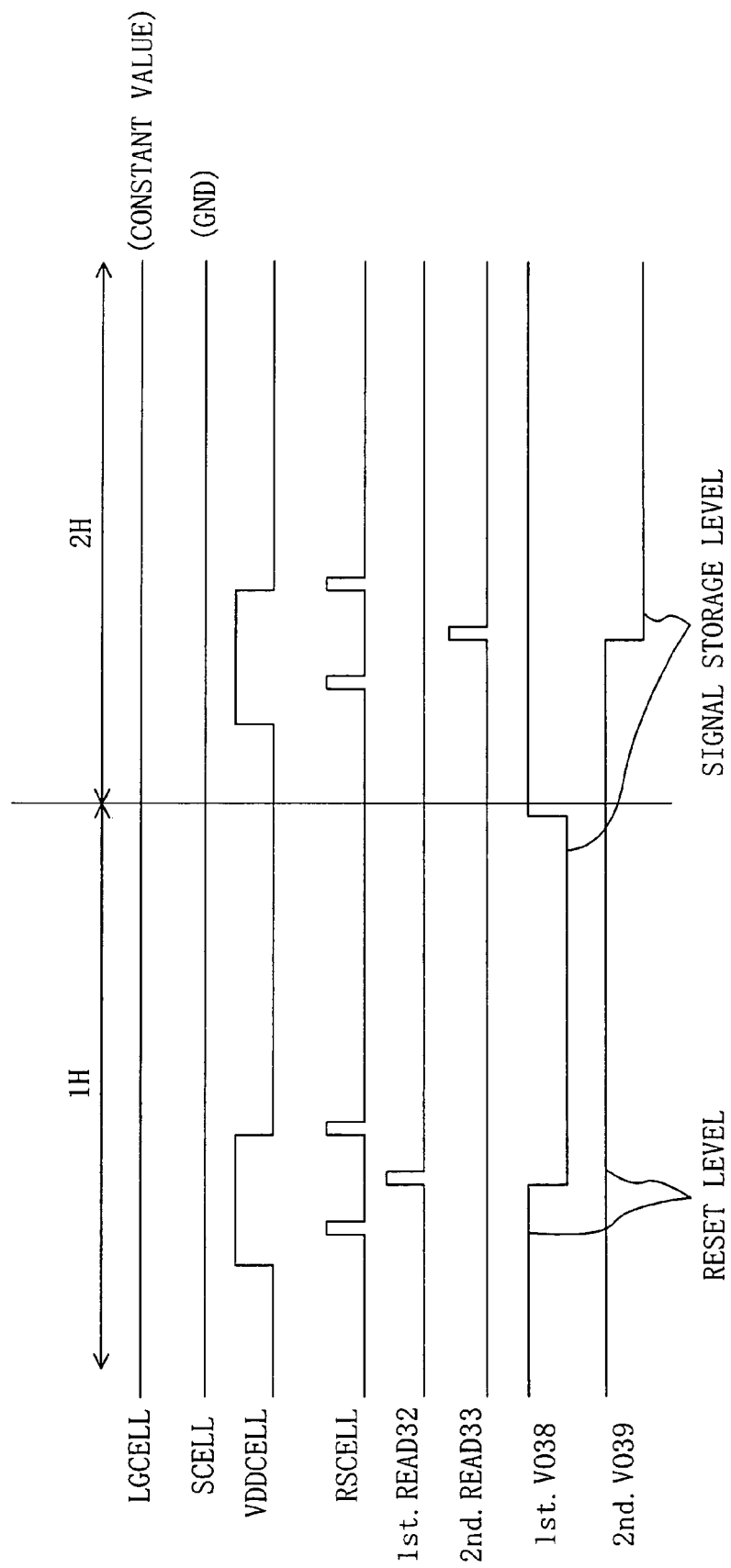
FIG. 2 is a timing chart showing timing for driving the solid state imaging apparatus of the first embodiment.

FIG. 2 is a timing chart showing timing for driving the solid state imaging apparatus of the first embodiment. In this case, a series of operations is completed in a horizontal blanking period (=1 H).

Moreover, as for the detection order of signal charges from the PD sections 1 through 8 arranged in an array, detection is simultaneously carried out in the first and second rows and then detection is simultaneously carried out in the third and fourth rows.

As shown in FIG. 2, first, high level voltage is applied to the LGCELL line 40 so that each of the load transistors 25 and 26 becomes a constant current source, and then during a period in which the potential of the VDDCELL line 31 is high level, each of the RSCELL lines 36 and 37 is set to be a high level in a pulse state to temporarily turn each of the reset transistors 21 and 22 ON. Thus, each of charges stored in the first FD section 9 in the first photoelectric conversion cell 91 and in the second FD section 10 in the second photoelectric conversion cell 92 is made to flow through the VDDCELL line 31. In this case, in each of the pixel amplifier transistors 23 and 24, a signal level at the reset time is detected, the detected signal level is introduced to a noise cancellation circuit (not shown) via each of the VO lines 38 and 39. The introduced signal level is clamped by the noise cancellation circuit.

Next, after each of the reset transistor 21 and 22 has been turned OFF; high level voltage is applied in an pulse state to the first READ line 32 to simultaneously turn transfer transistors 13 and 14 ON. Thus, charge stored in the ID section 1 in the first row is transferred to the first FD section 9 while charge stored in the PD section 2 is transferred to the second FD section 10. For charges transferred to the first FD section 9 and the second FD section 10, voltage levels of stored signals are detected in the first pixel amplifier transistor 23 and the second pixel amplifier transistor 24, respectively. Furthermore, the detected voltage levels are introduced to the noise cancellation circuit via the first VO line 38 and the second VO line 39, respectively. Thus, sampling of each of the signals is performed by the noise cancellation circuit. By this series of operations, output signals from which variations in threshold and noise components have been removed and which are held by the pixel amplifier transistors 23 and 24 can be detected.

Subsequently, when the VDDCELL line 31 is turned to be in a low level OFF state and each of the RSCELL lines 36 and 37 is temporarily turned ON, each of the respective potentials of the FD sections 9 and 10 becomes in the same OFF level state as that of the VDDCELL line 31. Thus, each of the pixel amplifier transistors 23 and 24 stops its operation.

After this, in a vertical line scanning circuit, until each of the first RSCELL lines 36 and 37 and the first READ line 32 are selected, each of the pixel amplifier transistors 23 and 24 is not operated and thus the vertical line scanning circuit is in a non-select state.

In a subsequent horizontal blanking period 2H, each of the reset transistors 21 and 22 is temporarily turned ON to reset charges of FD sections 9 and 10. In this case, as has been described, in each of the pixel amplifier transistors 23 and 24, a signal level at a reset time is detected, the detected signal levels are introduced to the noise cancellation circuit via each of the VO lines 38 and 39, respectively. The introduced signal levels are clamped by the noise cancellation circuit.

Next, after each of the reset transistor 21 and 22 has been turned OFF, high level voltage is applied in an pulse state to the second READ line 33 to simultaneously turn transfer transistors 17 and 18 ON. Thus, charge stored in the PI) section 4 in the first row is transferred to the first FD section 9 while charge stored in the PD) section 6 in the second row is transferred to the second FD section 10.

Thereafter, in the same manner as in the first horizontal blanking period 1H, for respective charges transferred to the first FD section 9 and the second FD section 10, voltage levels of stored signals are detected in the first pixel amplifier transistor 23 and the second pixel amplifier transistor 24, respectively. Furthermore, the detected voltage levels are introduced to the noise cancellation circuit via the first VO line 38 and the second VO line 39, respectively. Thus, sampling of each of the signals is performed by the noise cancellation circuit. By this series of operations, output signals from which variations in threshold and noise components have been removed and which are held by the pixel amplifier transistors 23 and 24 can be detected.

In this manner, charges detected during the first horizontal blanking period 1H and charges detected during the second horizontal blanking, period 2H are processed in signal processing circuits (not shown), respectively, so that charges photoelectric-converted in the first and second rows can be detected as an image corresponding to actual positions of the charges.

Subsequently by driving the PD sections in the third and fourth rows in the same manner as that of driving the PD sections in the first and second rows, signals can be detected throughout the array.

Note that in the first embodiment, the circuit configuration and driving method in which after every second column, i.e., every odd-numbered column including the PD sections 1 and 2 have been read out, charges in every even-numbered column including the PD sections 5 and 6 are detected have been described. However, this embodiment is not limited thereto but READ lines can be increased to detect charge in every third column at the same timing as described above.

In the solid state imaging apparatus of the first embodiment as shown in the circuit configuration of FIG. 1, for example, four PD sections share a FD section, a pixel amplifier transistor and a reset transistor. Thus, the number of transistors per photoelectric conversion cell can be finally reduced from 4 (required in the known solid state imaging apparatus) to 1.5. The number of interconnects can be reduced from 5 (required in the known solid state imaging apparatus) to 2.5. For example, if photoelectric conversion cell is designed, assuming that the area of a photoelectric conversion cell is 4.1 μm×4.1 μm, with the design rule of 0.35 μm, the aperture ratio of PD sections to the photoelectric conversion cell is about 35%. Therefore, it is possible to reduce the cell sizes of the photoelectric conversion cells 91 and 92 and to largely increase the aperture ratio of the PD section at the same time.

In this connection, assume that a configuration in which signal charges from two photoelectric conversion sections included in adjacent rows are detected by a READ line at the same timing is applied to the known circuit configuration. If a photoelectric conversion cell is designed, assuming that the area of a photoelectric conversion cell is 4.1 μm×4.1 μm, with the design rule of 0.35 μm, the aperture ratio of PD sections is about 10%.

Moreover, assume that a configuration in which signal charges from two photoelectric conversion sections included in adjacent rows are read out by a READ line, and a FD section and a pixel amplifier transistor included in a row which adjacent to an unread row in a photoelectric conversion cell are shared by two photoelectric sections to detect signal charge is applied to the known circuit configuration. With a driving method in which signal charges are simultaneously detected in the two photoelectric conversion sections, for example, if a photoelectric conversion cell is designed, assuming that the area of a photoelectric conversion cell is 4.1 μm×4.1 μm, with the design rule of 0.35 μm, the aperture ratio of PD sections is about 15%.

Modified Example of First Embodiment

Figure 3:
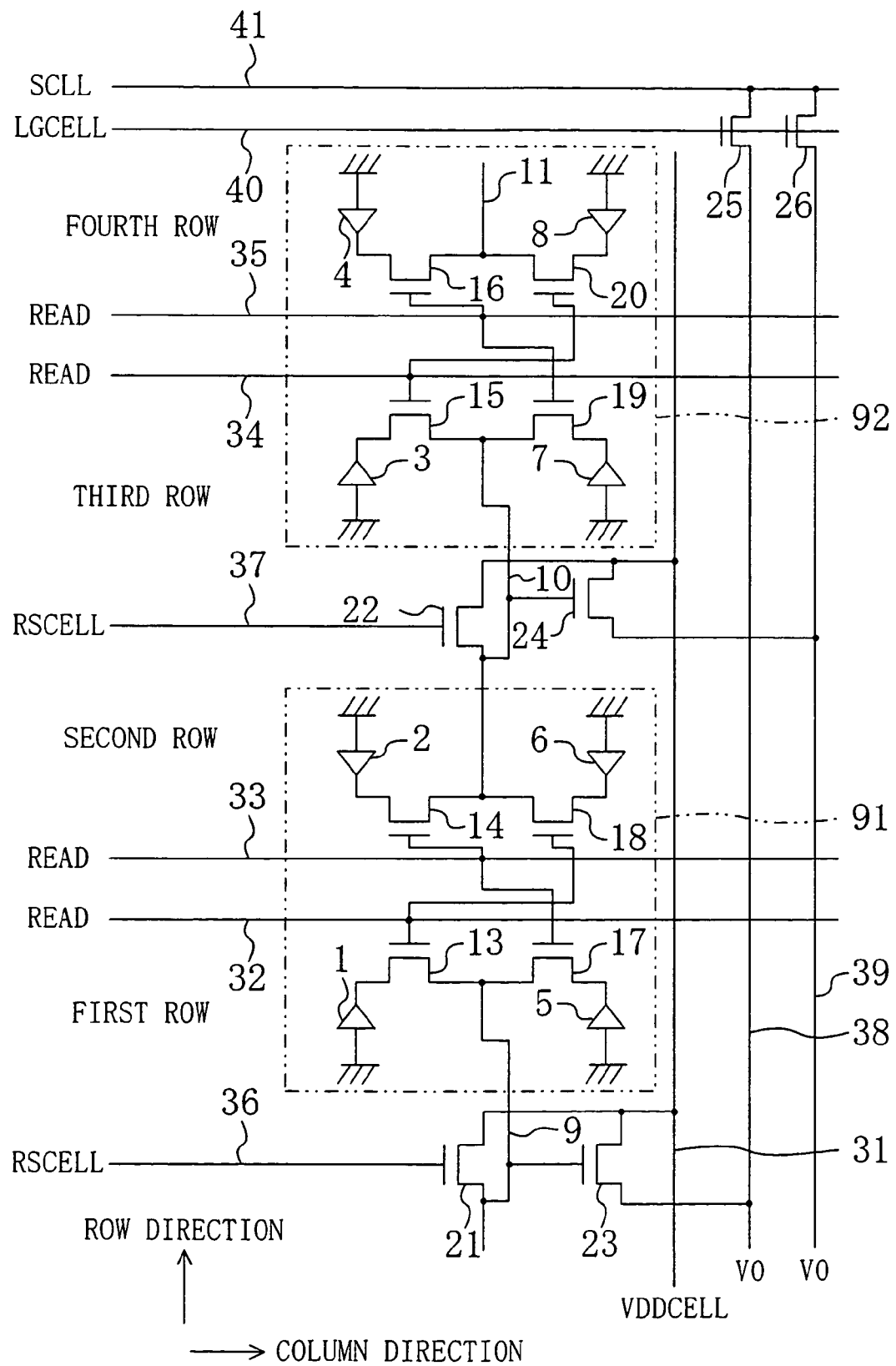
FIG. 3 is a circuit diagram illustrating an exemplary photoelectric conversion cell in a solid state imaging apparatus according to a modified example of the first embodiment.

FIG. 3 is a diagram illustrating a circuit configuration of a photoelectric conversion cell in a solid state imaging apparatus according to a modified example of the first embodiment of the present invention. Also, in this modified example each member also shown in FIG. 1 is identified by the same reference numeral, and therefore, description thereof will be omitted.

As shown in FIG. 3, for example, in the first photoelectric conversion cell 91, the first READ line 32 is connected to the transfer transistor 13 and the transfer transistor 18 included in adjacent columns, respectively, while the second READ line 33 is connected to the transfer transistor 14 and the transfer transistor 17 included in adjacent columns, respectively. Thus, even if connections are made with respect to the PD sections 1, 2, 5 and 6 included in two adjacent rows with the first and second READ lines 32 and 33 interposed between the PD sections 1 and 5 and the PD sections 2 and 6 so that signal charges from the PD sections which are not included in the same column are transferred, charge can be deflected at the same timing as that shown in FIG. 2.

For example, when the first READ line 32 is temporarily turned ON, signal charge is transferred from the PD section 1 to the first FD section 9 via the transfer transistor 13 one, at the same time signal charge is transferred from the PD section 6 to the second FD section 10 via the transfer transistor 18.

Note that in the modified example of the first embodiment, signal charges from two of the four PD sections included in a photoelectric conversion cell 91 are read not during the horizontal blanking period 1H. However, instead of this, signal charges from all of the four PD sections may be read out.

Moreover, by performing signal processing to signal charges from all of the photoelectric conversion cells which have been read out during different horizontal blanking periods, a high quality image with a large number of pixels can be obtained.

Second Embodiment

Hereinafter, a second embodiment of the present invention will be described with reference to the accompanying drawings.

Figure 4:
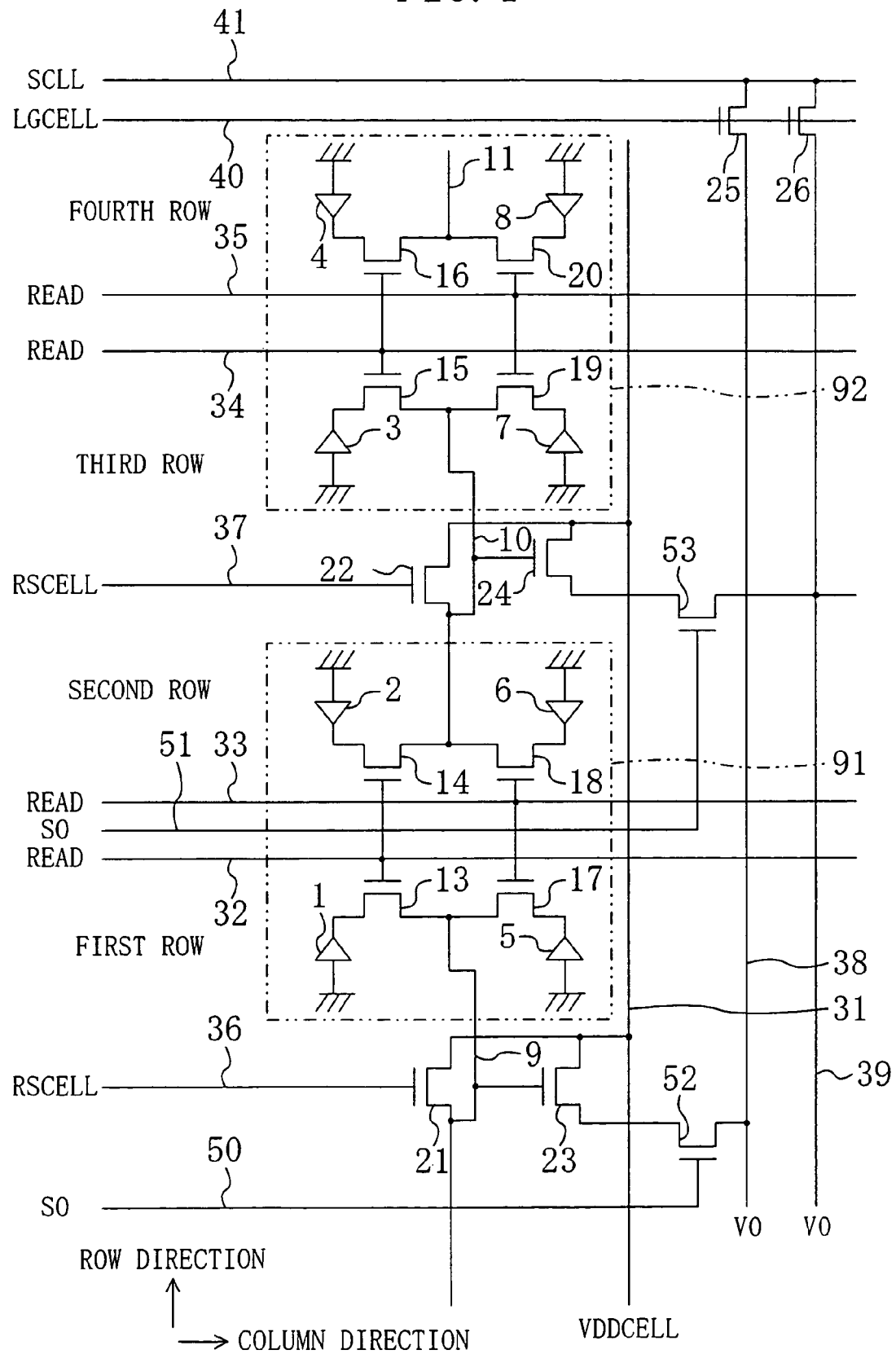
FIG. 4 is a circuit diagram illustrating an exemplary photoelectric conversion cell in a solid state imaging apparatus according to a second embodiment of the present invention.

FIG. 4 is a diagram illustrating an example of circuit configuration of a photoelectric conversion cell in a solid state imaging apparatus according to a second embodiment of the present invention. In FIG. 4, each member also shown in FIG. 1 is identified by the same reference numeral, and therefore, description thereof will be omitted.

First, differences of the solid state imaging apparatus of FIG. 4 from that of the first embodiment shown in FIG. 1 will be described.

In the second embodiment, an configuration in which the first and second pixel amplifier transistors 23 and 24 are connected to the first and second output signal (VO) lines 38 and 39, respectively, via the first and second select transistors 52 and 53 each of which made of an N channel FET, respectively, is used.

To the respective gates of the first and second select transistors 52 and 53, first and second select (SO) lines 50 and 51 to which a switching pulse is applied are connected, respectively.

Hereinafter, the operation of the solid state imaging apparatus having the above-described configuration will be described with reference to the accompanying drawings.

Figure 5:
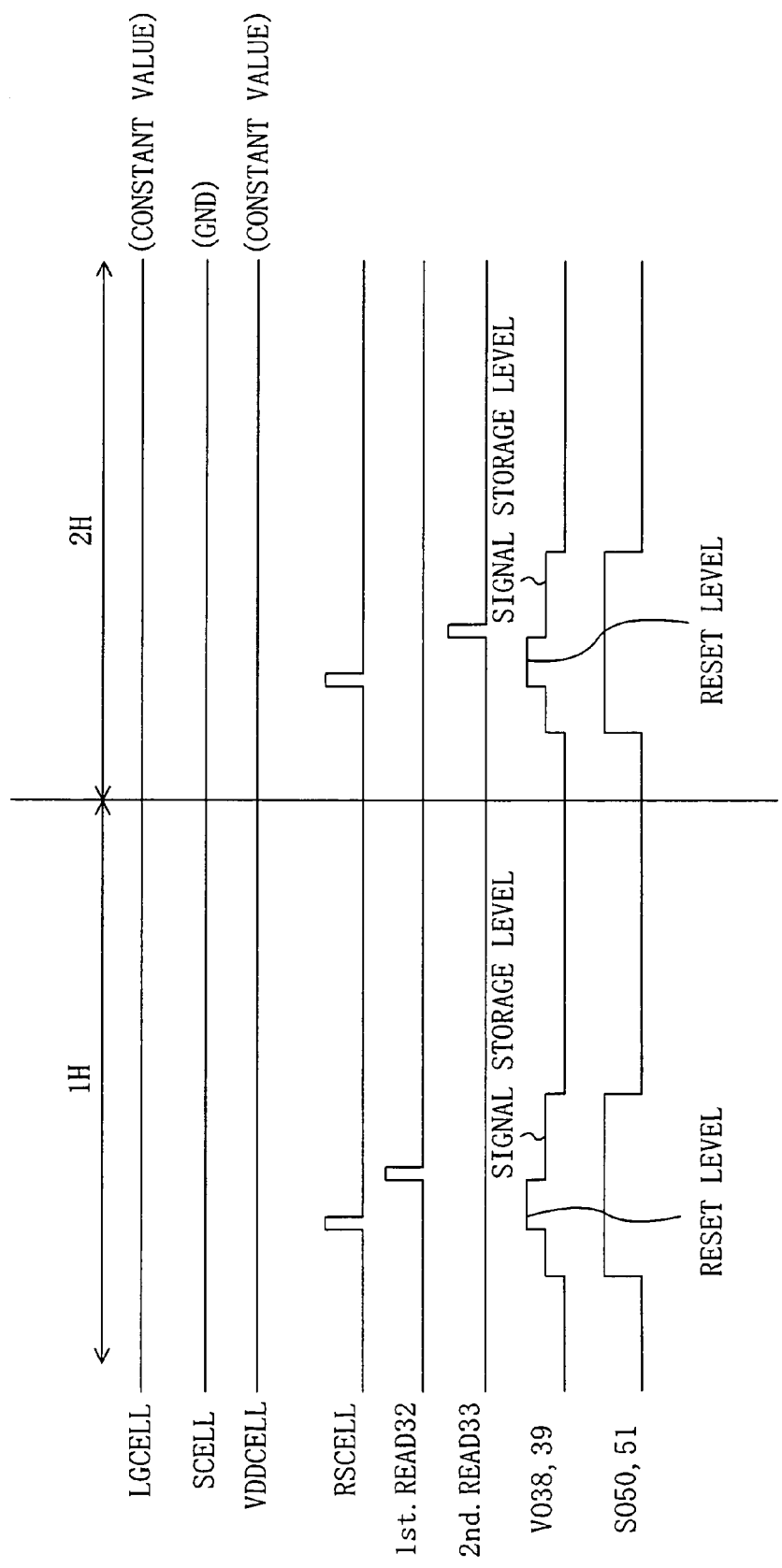
FIG. 5 is a timing chart showing timing for driving the solid state imaging apparatus of the second embodiment.

FIG. 5 is a timing chart showing timing for driving the solid state imaging apparatus of the second embodiment. In this case, a series of operations is completed in a horizontal blanking period (=1 H).

As shown in FIG. 5, first, a predetermined voltage is applied to the LGCELL line 40 so that each of the load transistors 25 and 26 becomes a constant current source and the potential of the VDDCELL line 31 is set to be a high level. Subsequently, each of the RSCELL lines 36 and 37 is set to be a high level in a pulse state to temporarily turn each of the reset transistors 21 and 22 ON. Thus, each of charges stored in the first FD section 9 and in the second FD section 10 is made to flow through the VDDCELL line 31. In this case, in each of the pixel amplifier transistors 23 and 24, each of the select transistors 52 and 53 has been turned ON in advance, so that a signal level at a reset time is detected, the detected signal level is introduced to a noise cancellation circuit (not shown) via each of the VO lines 38 and 39. The introduced signal level is clamped by the noise cancellation circuit.

Next, after each of the reset transistor 21 and 22 has been turned OFF, high level voltage is applied in an pulse state to the first READ line 32 to simultaneously turn transfer transistors 13 and 14 ON. Thus, charge stored in the PD section 1 in the first row is transferred to the first FD section 9 while charge stored in the PD section 2 is transferred to the second FD section 10. Thereafter, for charges transferred to the first FD section 9 and the second FD section 10, voltage levels of stored signals are detected in the first pixel amplifier transistor 23 and the second pixel amplifier transistor 24, respectively.

Subsequently, by changing each of the first and second SO lines 50 and 51 to a high level to keep the first and second transistors 52 and 53 ON, stored charge signals of the first pixel amplifier transistor 23 and the second pixel amplifier transistor 24 are introduced to the noise cancellation circuit via the first VO line 38 and the second VO line 39, respectively. Thus, sampling of each of the signals is performed by the noise cancellation circuit.

Thereafter, each of the first and second SO lines 50 and 51 is set back to be a low level to turn the first and second select transistors 52 and 53 OFF, so that each of the pixel amplifier transistors 23 and 24 stops its operation.

After this, in a vertical line scanning circuit, until each of the first RSCELL lines 36 and 37 and the first READ line 32 is selected, each of the pixel amplifier transistors 23 and 24 is not operated. Thus, the vertical line scanning circuit becomes in a non-select state.

In a subsequent horizontal blanking period 2H, each of the reset transistors 21 and 22 is temporarily turned ON to reset charges of the FD sections 9 and 10. In this case, as has been described, in each of the pixel amplifier transistors 23 and 24, a signal level at the reset time is detected, the detected signal levels are introduced to the noise cancellation circuit via each of the VO lines 38 and 39, respectively. The introduced signal levels are clamped by the noise cancellation circuit.

Next, after each of the reset transistor 21 and 22 has been turned OFF, high level voltage is applied in all pulse state to the second READ line 33 to simultaneously turn transfer transistors 17 and 18 ON. Thus, charge stored in the PD section 5 in the first row is transferred to the first FD section 9 while charge stored in the PD section 6 in the second row is transferred to the second FD section 10.

Thereafter, in the same manner as in the first horizontal blanking period 1H, for respective charges transferred to the first FD section 9 and the second FD section 10, voltage levels of stored signals are detected in the first pixel amplifier transistor 23 and the second pixel amplifier transistor 24, respectively. Furthermore, the stored signals whose voltage level have been detected selectively conducts the first and second VO lines 38 and 39 and are introduced to the noise cancellation circuit. Then; sampling of each of the signals is performed by the noise cancellation circuit. By this series of operations, output signals from which variations in threshold and noise components have been removed and which are held by the pixel amplifier transistors 23 and 24 can be detected.

Thus, with the first and second select transistors 52 and 53 between the FD section 9 and the first VO line 38 and between the FD section 10 and the second VO line 39, respectively. Thus, the number of transistors per photoelectric conversion cell is 1.75. Moreover, the number of interconnects is 2.75. Therefore, it is possible to reduce the cell size of each of the photoelectric conversion cells 91 and 92 and also to largely improve the aperture ratio of PD sections.

Note that also in the second embodiment, as in the modified example of the first embodiment, for example, a configuration in which the transfer transistor 13 and the transfer transistor 18 located diagonally to the transfer transistor 13 are connected to the first READ line 32, and the transfer transistor 14 and the transfer transistor 17 located diagonally to the transfer transistor 14 are connected to the second READ line 33 may be used.

Moreover, in the photoelectric conversion cell 91, the PD sections are arranged in two rows and two columns. However, the present invention is not limited thereto, but the PD sections may be arranged in two rows and three columns and, furthermore, may be arranged in three or more rows and three or more columns.

Third Embodiment

Hereinafter, a third embodiment of the present invention will be described with reference to the accompanying drawings.

Figure 6:
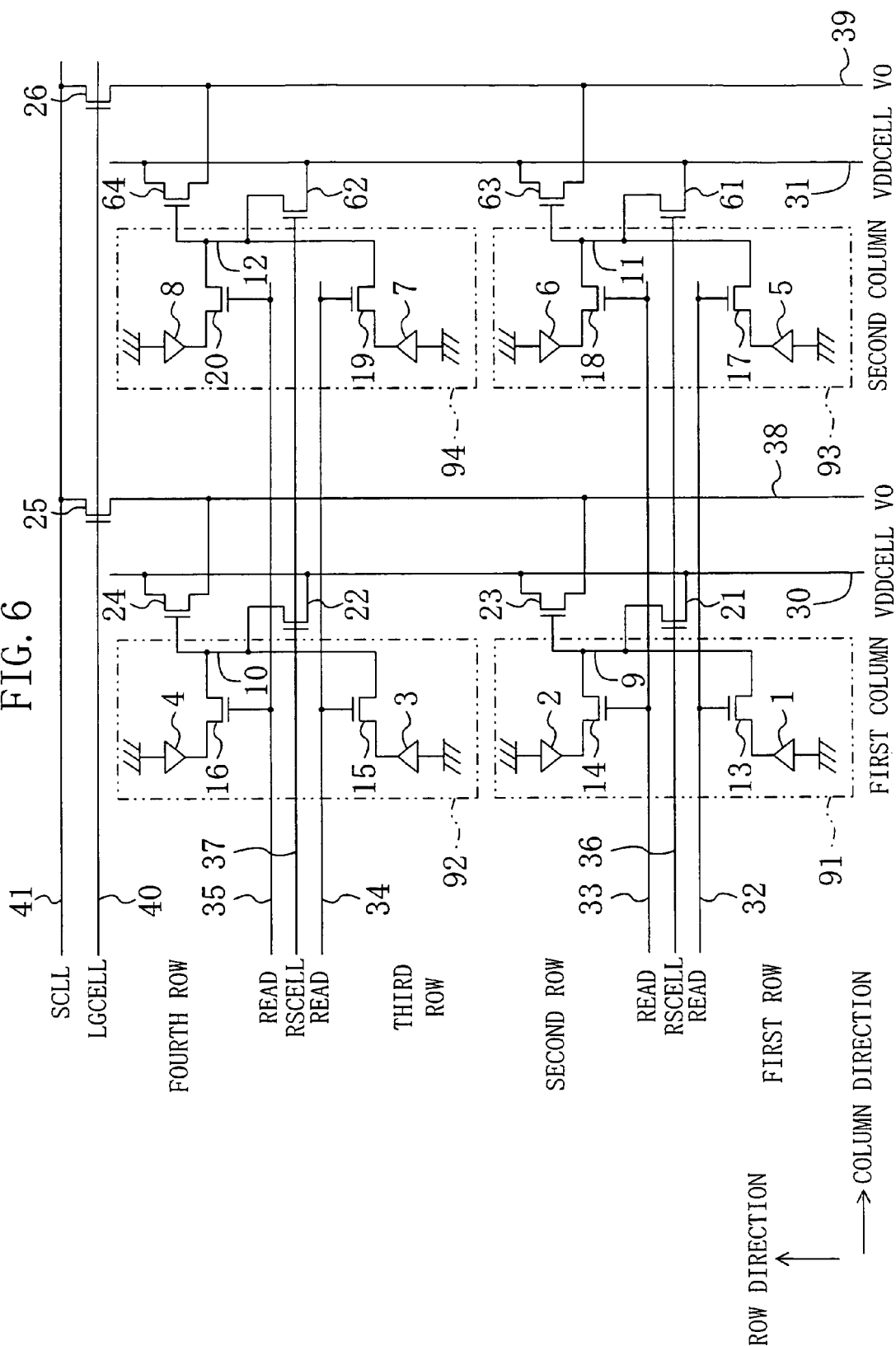
FIG. 6 is a circuit diagram illustrating an exemplary photoelectric conversion cell in a solid state imaging apparatus according to a third embodiment of the present invention.

FIG. 6 is a diagram illustrating an example of circuit configuration of a photoelectric conversion cell in a solid state imaging apparatus according to a third embodiment of the present invention. In FIG. 6, each member also shown in FIG. 1 is identified by the same reference numeral, and therefore, description thereof will be omitted.

As shown in FIG. 6, in the solid state imaging apparatus of the third embodiment, first through fourth photoelectric conversion cells 91, 92, 93 and 94 are arranged in a matrix.

For example, the first photoelectric conversion cell 91 includes photoelectric conversion (PD) sections 1 and 2 arranged in regions which is located in the first column of an array and the first row and which is located in the first column of and the second rows of the array, respectively. The PD sections 1 and 2 share a first FD section 9 via transfer transistors 13 and 14 each of which is made of an N channel FET, respectively.

To the first FD section 9, the first reset transistor 21 made of an N channel FET is connected. The first reset transistor 21 includes a source connected to the first FD section 9, a drain connected to the first FD section 9 and a gate connected to a first RSCELL line 36. Thus, charge stored in the first FD section 9 is made to flow through a first VDDCELL line 30 by a RSCELL signal.

To the first FD section 9 and the first reset transistor 21, a first pixel amplifier transistor 23 of an N channel FET is connected. The first pixel amplifier transistor made of an N channel FET includes a gate connected to the first FD section 9, a drain connected to the first VDDCELL line 30 and a source connected to a first VO line 38.

In the same manner, PD sections 3 and 4 arranged in regions of an array forming a second photoelectric conversion cell 92 which is located in the first column and the third row and which is located in the first column and the fourth row, respectively, share a second FD section 10 via transfer transistors 15 and 16, respectively. A second reset transistor 22 selectively conducts the second FD section 10 and the first VDDCELL line 30. Moreover, a second pixel amplifier transistor 24 which receives the signal potential of the second FD section 10 at the gate and receives the power supply potential of the first VDDCELL line 30 at the drain outputs a detected signal corresponding to a received signal potential to the first VO line 38.

PD sections 5 and 6 arranged in regions of an array forming a third photoelectric conversion cell 93 which is located in the second column and the first row and which is located in the second column and the second row, respectively, share a third FD section 11 via transfer transistors 17 and 18, respectively. A third reset transistor 61 selectively conducts the third FD section 11 and a second VDDCELL line 31. Moreover, a third pixel amplifier transistor 63 which receives the signal potential of the third FD section 11 at the gate and receives the power supply potential of the second VDDCELL line 31 at the drain outputs a detected signal corresponding to a received signal potential to a second VO line 39.

PD sections 7 and 8 arranged in regions of an array forming a fourth photoelectric conversion cell 94 which is located in the second column and the third row and which is located in the second column and the fourth row, respectively, share a fourth FD section 12 via transfer transistors 19 and 20, respectively. A fourth reset transistor 62 selectively conducts the fourth FD section 12 and a second VDDCELL line 31. Moreover, a fourth pixel amplifier transistor 64 which receives the signal potential of the fourth FD section 12 at the gate and receives the power supply potential of the second VDDCELL line 31 at the drain outputs 3 detected signal corresponding to a received signal potential to a second VO line 39.

Hereinafter, the operation of the solid state imaging apparatus having the above-described configuration will be described with reference to the accompanying drawings.

Figure 7:
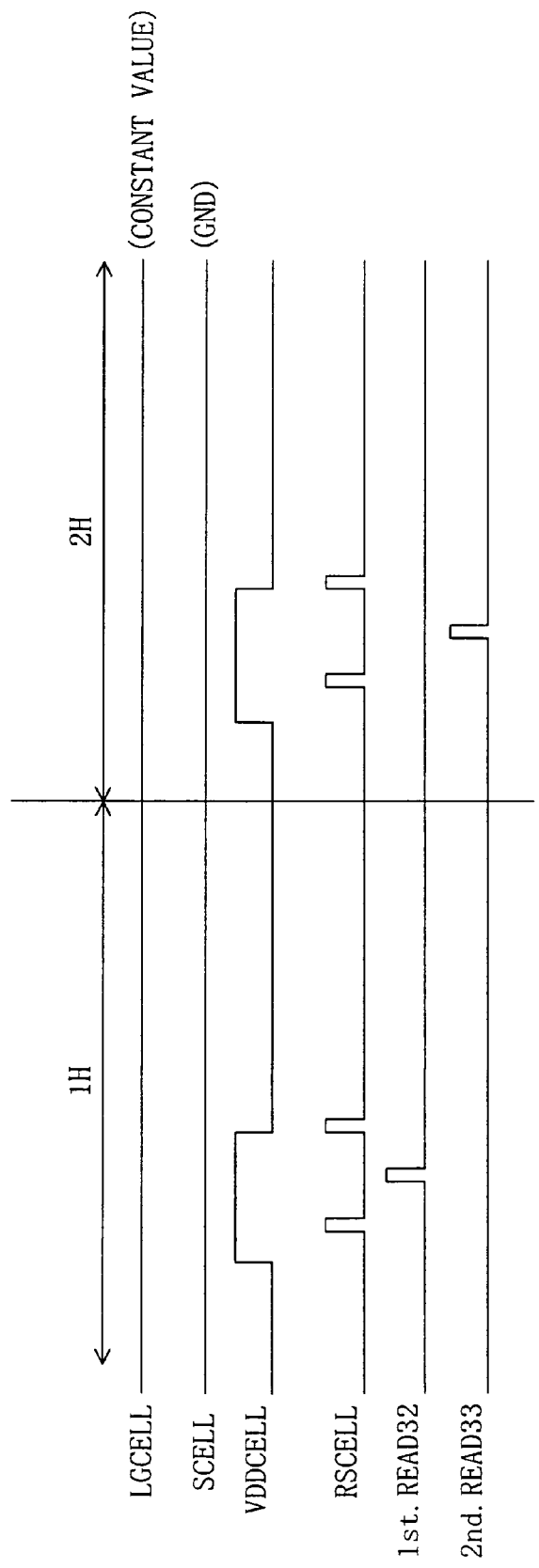
FIG. 7 is a timing chart showing timing for driving the solid state imaging apparatus of the third embodiment.

FIG. 7 is a timing chart showing timing for driving the solid state imaging apparatus of the third embodiment. In this case, a series of operations is completed in a horizontal blanking period (=1 H).

Moreover, as for the detection order of signal charges from the PD sections 1 through 8 arranged in an array, detection is carried out sequentially from the first row to the second row and so on.

As shown in FIG. 7, first, high level voltage is applied to a LGCELL line 40 so that each of the load transistors 25 and 26 becomes a constant current source, and then during a period in which the potentials of the first VDDCELL line 30 and the VDDCELL line 31 are set to be high level, the first RSCELL lines 36 is set to be high level in a pulse state to temporarily turn each of the reset transistors 21 and 61 ON. Thus, charges stored in the first FD section 9 in the first photoelectric conversion cell 91 and in the third FD section 11 in the third photoelectric conversion cell 93 are made to flow through the first VDDCELL line 30 and the VDDCELL line 31, respectively. In this case, in each of the pixel amplifier transistors 23 and 63, a signal level at the reset time is detected, the detected signal level is introduced to a noise cancellation circuit (not shown) via each of the VO lines 38 and 39. The introduced signal level is clamped by the noise cancellation circuit.

Next, after each of the reset transistor 21 and 61 has been turned OFF, high level voltage is applied in an pulse state to the first READ line 32 to simultaneously turn transfer transistors 13 and 14 ON. Thus, charge stored in the PD section 1 in the first row is transferred to the first FD section 9 while charge stored in the PD section 5 in the second row is transferred to the third FD section 11. For charges transferred to the first FD section 9 and the third FD section 11, voltage levels of stored signals are detected in the first pixel amplifier transistor 23 and the third pixel amplifier transistor 63, respectively. Furthermore, the detected voltage levels are introduced to the noise cancellation circuit via the first VO line 38 and the second VO line 39, respectively. Thus, sampling of each of the signals is performed by the noise cancellation circuit. By this series of operations, output signals from which variations in threshold and noise components have been removed and which are held by the pixel amplifier transistors 23 and 63 can be detected.

Subsequently, when each of the VDDCELL lines 30 and 31 is turned to be in a low level OFF state and the first RSCELL line 36 is temporarily turned ON, each of the respective potentials of the FD sections 9 and 11 becomes in the same OFF level state as that of each of the VDDCELL lines 30 and 31. Then, each of the pixel amplifier transistors 23 and 63 stops its operation.

After this, in a vertical line scanning circuit, until each of the first RSCELL line 36 and the first READ line 32 are selected, each of the pixel amplifier transistors 23 and 63 is not operated. Thus, the vertical line scanning circuit becomes in a non-select state.

In a subsequent horizontal blanking period 2H, each of the reset transistors 21 and 61 temporarily turned ON to reset charges of the FD sections 9 and 11. In this case, as has been described, in each of the pixel amplifier transistors 23 and 63, a signal level at the reset time is detected, detected signal levels are introduced to the noise cancellation circuit via each of the VO lines 38 and 39, respectively the introduced signal levels are clamped by the noise cancellation circuit.

Next, after each of the reset transistor 21 and 61 has bee turned OFF, high level voltage is applied in an pulse state to the second READ line 33 to simultaneously turn transfer transistors 14 and 18 ON. Thus, charge stored in the PD section 2 in the first row is transferred to the first FD section 9 while charge stored in the PD section 6 in the second row is transferred to the third FD section 11.

Thereafter, in the same manner as in the first horizontal blanking period 1 H, for respective charges transferred to the first FD section 9 and the third FD section 11, voltage levels of stored signals are detected in the first pixel amplifier transistor 23 and the third pixel amplifier transistor 63, respectively. Furthermore, the detected voltage levels are introduced to the noise cancellation circuit via the first VO line 38 and the second VO line 39, respectively. Thus, sampling of each of the signals is performed by the noise cancellation circuit. By this series of operations, output signals from which variations in threshold and noise components have been removed and which are held by the pixel amplifier transistors 23 and 63 can be detected In this manner, charges detected during the first horizontal blanking period 1 H and charges detected during the second horizontal blanking period 2 H are processed in signal processing circuits (not shown), respectively, so that charges photoelectric-converted in the first and second rows can be detected as an image corresponding to actual positions of the charges. Thus, in the third embodiment, for example, the power supply potentials which are to be applied to the respective drains of the first reset transistor 21 and the first pixel amplifier transistor 23 vary in the same manner. Therefore, the known row selection transistor 152 is not necessarily provided.

Subsequently, if the PD sections in the third and fourth rows are driven in the same manner as that of driving the PD sections in the first and second rows, signals can be detected throughout the array.

As has been described, the solid state imaging apparatus of the third embodiment has for example, a configuration in which the two PD sections 1 and 2 share the first FD section 9, the first pixel amplifier transistor 23 and the first reset transistor 21. Thus, the number of transistors per photoelectric conversion cell can be finally reduced from 4 (required in the known solid state imaging apparatus) to 2. Moreover, the number of interconnects can be reduced from 5 (required in the known apparatus) to 3.5. Accordingly, if a photoelectric conversion cell is designed, assuming that the area of a photoelectric conversion cell is 4.1 µm×4.1 µm, with the design rule of 0.35 µm, the aperture ratio of the PD sections 1 and 2 is about 30%. Therefore, it is possible to reduce the cell size of each of the photoelectric conversion cells and also to largely improve the aperture ratio of the PD section.

Note that each of the reset transistors 21, 22, 61 and 62 is made of an N channel type MOS transistor. However, in each of the reset transistors 21, 22, 61 and 62 made of instead of an N channel type MOS transistor, a P channel type MOS transistor, when low level voltage is applied to the first and second RSCELL lines 36 and 37, each of the reset transistors 21, 22, 61 and 62 is turned ON.

In the same manner, each of the pixel amplifier transistors 23, 24, 63 and 64 is made of an N channel type MOS transistor. However, in each of the pixel amplifier transistors 23, 24, 63 and 64 made of, instead of an N channel type MOS transistor, a P channel type MOS transistor, when low level voltage is applied to the first and second VDDVELL lines 30 and 31, each of the pixel amplifier transistors 23, 24, 63 and 64 is turned ON to be in a potential detection period in which signal potentials from the corresponding FD sections 9, 10, 11 and 12 are detected.

Figure 8:
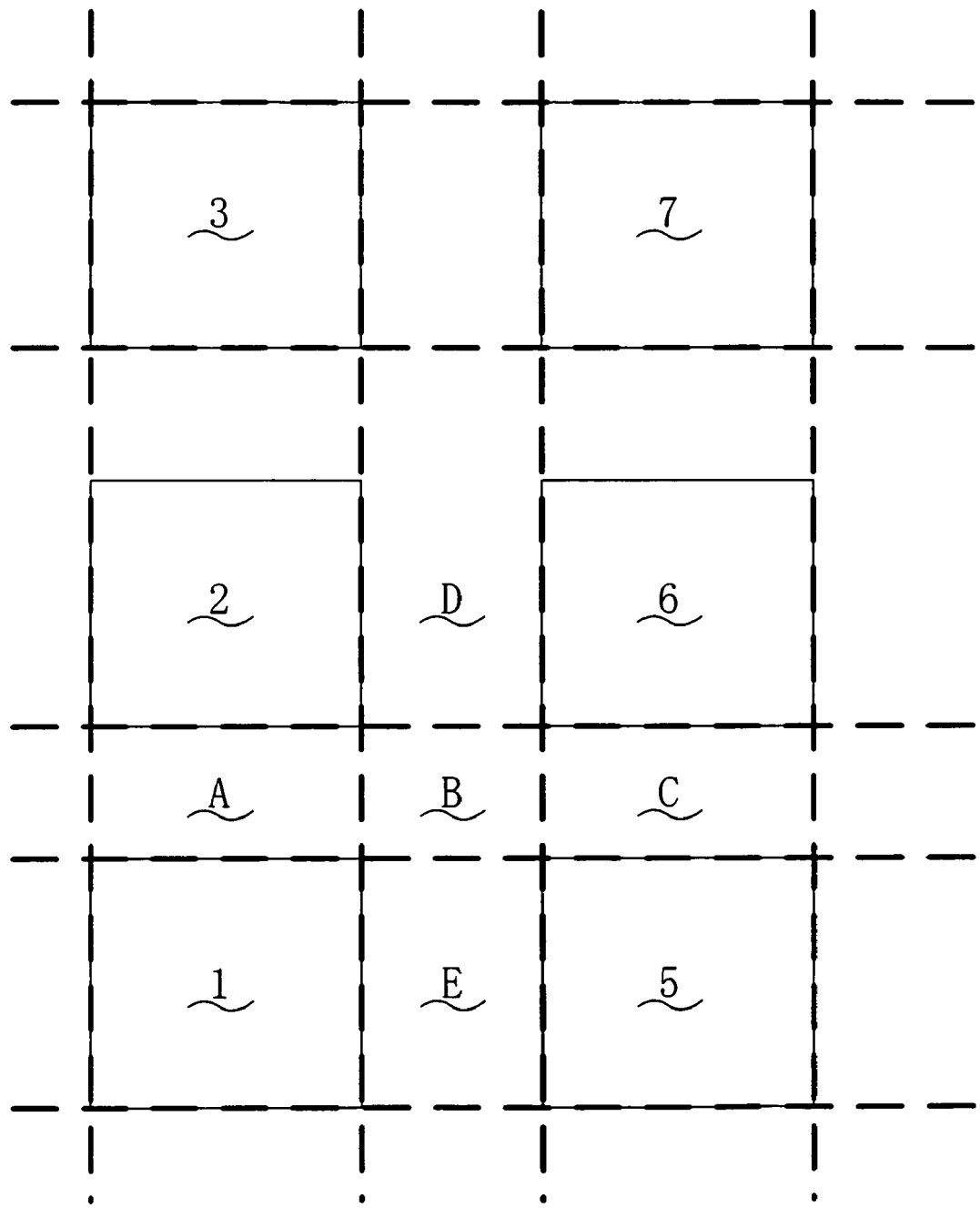
FIG. 8 is a plane view schematically illustrating a layout of the photoelectric conversion cell in the solid state imaging apparatus of the third embodiment.
Figure 10:
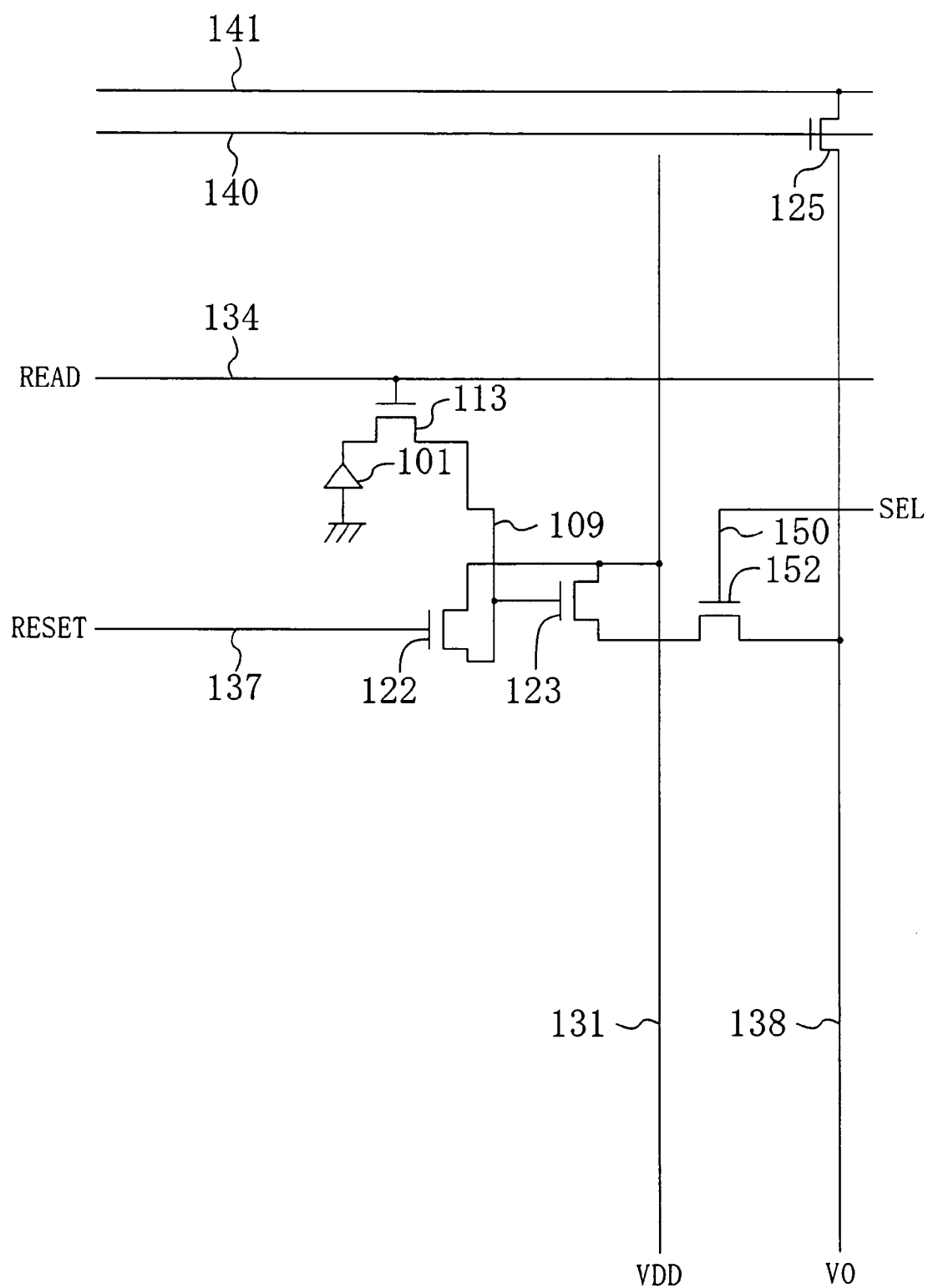
FIG. 10 is a circuit diagram illustrating a photoelectric conversion cell in a known solid imaging apparatus.

Hereinafter, in the layout in which each of the PD sections 1, 2, 3, 5, 6 and 7 arranged as shown in FIG. 8, a region of the cell located between the PD sections 1 and 2 is referred to as an "A region"; a region of the cell surrounded by the PD sections 1, 2, 5 and 6 is referred to as a "B region"; a region of the cell located between the PD sections 5 and 6 is referred to as a "C region"; a region of the cell located between the PD sections 2 and 6 is referred to as a "D region"; and a region of the cell located between the PD sections 1 and 5 is referred to as an "E region". Then, by arranging the FD sections 9 and 11, the pixel amplifier transistors 23 and 63, and the reset transistors 21 and 61 in regions in the cell indicated in the FIG. 9, respectively, the aperture ratio of the PD sections to the photoelectric conversion cell can be improved in any case, compared to the known solid state imaging apparatus. Moreover, the size of the cell can be reduced.

Furthermore, as also shown in FIG. 9, if the FD sections 9 and 11 are arranged in the A and C regions, respectively, the aperture of the PD sections can be improved to be about 30% by arranging in parallel the READ lines 32 and 33 for driving the transfer transistors 13 and 14, respectively.

Moreover, as shown in FIG 9, for example, the aperture of the PD sections can be improved to be about 30% by arranging the first RSCELL line 36 between the PD sections 2 and 3.

Moreover, as shown in FIG. 8, by arranging the PD sections so as to be spaced apart from one another by a certain distance at least in one of the row direction and the column direction, inclination in the resolution of an image taken can be corrected. Therefore, a high quality image can be obtained.

Moreover, although not shown in the drawings, by using the first VDDCELL line 30 and the second VDDCELL line 31 as light-shielding films for separating the photoelectric conversion cells from one another, the first VO line 38 and the second VO line 39 can be formed in different interconnect layers. Thus, the sizes of the photoelectric conversion cells 91 and 92 can be reduced and also the aperture area of the PD sections can be increased.

Moreover, with the solid state imaging apparatus of any one of the first through third embodiments, a camera which is small-sized and provides a high resolution image can be obtained.

The invention claimed is:

1. A solid state imaging apparatus comprising:
   a plurality of photoelectric conversion cells each including a plurality of photoelectric sections arranged in a matrix including at least first and second rows and first and second columns;
   a plurality of floating diffusion sections each being shared by, and being connected to, the photoelectric sections which are included in the first row of each photoelectric conversion cell via a plurality of transfer transistors, respectively;
   a plurality of second floating diffusion sections each being shared by, and being connected to the photoelectric sections which are included in the second row of each photoelectric conversion cell via a plurality of transfer transistors, respectively;
   a plurality of read-out lines each being selectively connected to at least two of the transfer transistors that are not included in the same row;

a plurality of first pixel amplifier transistors each detecting and outputting the potential of each first floating diffusion section; and a plurality of second pixel amplifier transistors each detecting and outputting the potential of each second floating diffusion section, wherein in each photoelectric conversion cell, a gate of a first transfer transistors included in the first row and a gate of a second transfer transistor included in the second row are connected to each other, sharing one of the plurality of read-out lines, each floating diffusion section is disposed across the two photoelectric conversion cells adjacent to each other in row direction, and only two read-out lines are disposed within the photoelectric conversion cells.

2. The solid state imaging apparatus of claim 1, wherein,
the first and second pixel amplifier transistors are coupled to the first and second floating diffusion sections, respectively; and each of the first and second pixel amplifier transistors comprises a source follower transistor which detects and outputs a voltage potential converted from one of said first floating diffusion section and said second floating diffusion section.

3. The solid state imaging apparatus of claim 1, wherein the plurality of read lines are connected to a vertical scanning circuit.

4. The solid state imaging apparatus of claim 1, further comprising:
a plurality of a pair of signal lines outputting signals from the first pixel amplifier transistors and the second pixel amplifier transistors, respectively, to the outside.

5. The solid state imaging apparatus of claim 1, wherein each floating diffusion section and each pixel amplifier transistor are shared by the photoelectric sections in the first row of one of the photoelectric conversion cells and the photoelectric sections in the second row of another of the photoelectric conversion cells.

6. The solid state imaging apparatus of claim 1, further comprising:
a signal line for outputting a signal from each pixel amplifier transistor to the outside; and a select transistor which is provided between the pixel amplifier transistor and the signal line to selectively conduct between the pixel amplifier transistor and the signal line.

7. The solid state imaging apparatus of claim 1, wherein each floating diffusion section and each pixel amplifier transistor are shared by photoelectric conversion section which are adjacent to each other in the row direction or in the column direction.

8. The solid state imaging apparatus of claim 1, wherein in each floating diffusion section, a reset section for resetting charge stored in the floating diffusion section.

9. The solid state imaging apparatus of claim 1, wherein the photoelectric conversion section are arranged so as to be spaced apart from one another by a certain distance in the row direction or in the column direction.

10. The solid state imaging apparatus of claim 1, further comprising a signal processing circuit for processing an output signal from each pixel amplifier transistor.

11. The solid state imaging apparatus of claim 1, wherein the photoelectric conversion cells are separated from one another by a power supply line which also functions as a light-shielding film.

12. The solid state imaging apparatus of claim 1, wherein respective charges of the photoelectric conversion section each being connected to one of the read-out lines and being read out by the transfer transistors are read out by said first floating diffusion sections or said second floating diffusion sections.

13. A solid state imaging apparatus comprising:
a plurality of photoelectric conversion cells each including a plurality of photoelectric section arranged in a matrix including at least first and second rows and first and second columns;

a plurality of first floating diffusion sections each being shared by, and being connected to, the photoelectric sections which are included in the first row of each photoelectric conversion cell via a plurality of transfer transistors, respectively;

a plurality of second floating diffusion sections each being shared by, and being connected to the photoelectric sections which are included in the second row of each photoeletric conversion cell via a plurality of transfer transistors, respectively;

a plurality of read-out lines each being selectively connected to at least two of the transfer transistors that are not included in the same row;

a plurality of first pixel amplifier transistors each detecting and outputting the potential of each first floating diffusion section; and a plurality of second pixel amplifier transistors each detecting and outputting the potential of each second floating diffusion section, wherein in each photoelectric conversion cell, a gate of a first transfer transistor included in the first row and a gate of a second transfer transistor included in the second row are connected to each other, sharing one of the plurality of read-out lines, and wherein in each photoelectric conversion cell, a first read-out line is connected to a gate of a transfer transistor included in the first row and the first column and a gate of a transfer transistor included in the second row and the column, and a second read-out line is connected to a gate of a transfer transistor included in the first row and the second column and a gate of a transfer transistor included in the second row and the second column.

14. A solid state imaging apparatus comprising:
a plurality of photoelectric conversion cells each including a plurality of photoelectric sections arranged in a matrix including at least first and second rows and first and second columns;

a plurality of first floating diffusion sections each being shared by, and being connected to, the photoeletric sections which are included in the first row of each photoelectric conversion cell via a plurality of transfer transistors, respectively;

a plurality of second floating diffusion sections each being shared by, and being connected to the photoelectric sections which are included in the second row of each photoelectric conversion cell via a plurality of transfer transistors, respectively;

a plurality of read-out lines each being selectively connected to at least two of the transfer transistors that are not included in the same row;

a plurality of first pixel amplifier transistors each detecting and outputting the potential of each first floating diffusion section; and a plurality of first pixel amplifier transistors each detecting and outputting the potential of each second floating diffusion section, wherein in each photoelectric conversion cell, a gate of a first transfer transistor included in the first row and a gate of a second transfer transistor included in the second row are connected to each other, sharing one of the plurality of read-out lines, and wherein in each photoelectric conversion cell, a first read-out line is connected to a gate of a transfer transistor included in the first row and the first column and a gate of a transfer transistor included in the second row and the second column, and a second read-out line is connected to a gate of a transfer transistor included in the first row and the second column and a gate of a transfer transistor included in the second row and the first column.

15. The solid state imaging apparatus of claim 14, wherein the plurality of photoelectric elements are photo diodes.

16. A camera comprising a solid state imaging apparatus, the apparatus including:
- a plurality of photoeletric conversion cells each including a plurality of photoelectric sections arranged in a matrix including at least first and second rows and first and second columns;
- a plurality of first floating diffusion sections each being shared by, and being connected to, the photoelectric sections which are included in the first row of each photoelectric conversion cell via a plurality of transfer transistors, respectively;
- a plurality of second floating diffusion sections each being shared by, and being connected to the photoelectric sections which are included in the second row of each photoelectric conversion cell via a plurality of transfer transistors, respectively;
- a plurality of read-out lines each being selectively connected to at least two of the transfer transistors that are not included in the same row;
- a plurality of first pixel amplifier transistors each detecting and outputting the potential of each first floating diffusion section; and
- a plurality of second pixel amplifier transistors each detecting and outputting the potential of each second floating diffusion section, wherein in each photoelectric conversion cell, a gate of a first transfer transistor included in the first row and a gate of a second transfer transistor included in the second row are connected to each other, sharing one of the plurality of read-out lines, each floating diffusion section is disposed across the two photoelectric conversion cells adjacent to each other in a row direction, and only two read-out lines are disposed within the photoelectric conversion cells.

17. The camera of claim 16, wherein respective charges of the photoelectric conversion sections each being connected to one of the read-out lines and being read out by the transfer transistors are read out by said first floating diffusion sections or said second floating diffusion sections.

* * * * *